US008232572B2

(12) United States Patent
Fukuda

(10) Patent No.: US 8,232,572 B2
(45) Date of Patent: Jul. 31, 2012

(54) LIGHT EMITTING DEVICE

(75) Inventor: Koichi Fukuda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 335 days.

(21) Appl. No.: 12/674,240

(22) PCT Filed: Nov. 13, 2008

(86) PCT No.: PCT/JP2008/071060
§ 371 (c)(1),
(2), (4) Date: Feb. 19, 2010

(87) PCT Pub. No.: WO2009/064020
PCT Pub. Date: May 22, 2009

(65) Prior Publication Data
US 2011/0193116 A1    Aug. 11, 2011

(30) Foreign Application Priority Data

Nov. 14, 2007  (JP) .................................. 2007-295591
Nov. 14, 2007  (JP) .................................. 2007-295974
Dec. 20, 2007  (JP) .................................. 2007-328709

(51) Int. Cl.
*H01L 33/10* (2010.01)

(52) U.S. Cl. ........................................................ 257/98

(58) Field of Classification Search .......... 257/177–182, 257/749, E33.056–E33.059, E25.032, 116, 257/117, 9–21, 79–103, 918, E51.018–E51.022, 257/E33.001–E33.077, E33.054, E25.028, 257/432–437; 438/22–47, 69, 503, 507, 438/956; 313/504–506
See application file for complete search history.

(56) References Cited

U.S. PATENT DOCUMENTS

| | | | | |
|---|---|---|---|---|
| 7,402,939 B2 | 7/2008 | Kubota et al. | ............... | 313/110 |
| 7,538,487 B2 | 5/2009 | Hasegawa et al. | ............ | 313/504 |
| 7,671,528 B2 | 3/2010 | Fukuda et al. | ................ | 313/501 |
| 2002/0180348 A1 | 12/2002 | Oda et al. | ....................... | 313/506 |
| 2005/0088084 A1* | 4/2005 | Cok | ............................... | 313/506 |
| 2006/0066230 A1 | 3/2006 | Kubota et al. | ................. | 313/506 |
| 2007/0052660 A1* | 3/2007 | Montbach et al. | ............ | 345/102 |
| 2007/0236135 A1 | 10/2007 | Fukuda et al. | ............... | 313/503 |
| 2008/0067926 A1 | 3/2008 | Mizuno et al. | ................ | 313/504 |
| 2008/0185954 A1 | 8/2008 | Fukuda et al. | ................ | 313/483 |
| 2008/0303419 A1 | 12/2008 | Fukuda | ......................... | 313/504 |
| 2009/0021151 A1 | 1/2009 | Fukuda | ......................... | 313/504 |
| 2011/0001905 A1* | 1/2011 | Tanaka | ............................ | 349/96 |
| 2011/0025196 A1* | 2/2011 | Rakuff et al. | ................ | 313/504 |

FOREIGN PATENT DOCUMENTS

| | | |
|---|---|---|
| JP | 11-283751 | 10/1999 |
| JP | 11-307266 | 11/1999 |
| JP | 2004-014529 | 1/2004 |
| JP | 2006-100430 | 4/2006 |

* cited by examiner

*Primary Examiner* — Dao H Nguyen
*Assistant Examiner* — Tram H Nguyen
(74) *Attorney, Agent, or Firm* — Fitzpatrick, Cella, Harper & Scinto

(57) ABSTRACT

To improve light extraction efficiency of a light emitting device, the light emitting device includes: a first electrode; a second electrode provided on a light extraction side; an emission layer formed between the first electrode and the second electrode; a reflection surface located on the first electrode with respect to the emission layer; and a periodic structure at a node of interference generated by light emitted from the emission layer and light emitted from the emission layer to the reflection surface side and reflected on the reflection surface. The periodic structure is for diffracting light generated in the emission layer and guided in an in-plane direction of the light emitting device in a direction to the second electrode, and for extracting the light to the outside of the light emitting device.

18 Claims, 5 Drawing Sheets

CHANGE OF EMISSION INTENSITY RATIO (VERTICAL DIRECTION)

LIGHT EMITTING DEVICE

TECHNICAL FIELD

The present invention relates to a light emitting device.

BACKGROUND ART

An organic electroluminescent (EL) display, being a kind of light emitting device, is a new type of flat panel display and formed from an array of organic light-emitting diode (OLED) devices. In general, an OLED device is comprised of an electrode serving as the anode, an electrode serving as the cathode and several thin organic layers sandwiched between these two electrodes. The organic layers include at least one emission layer containing more than one fluorescent or phosphorescent organic compound to emit light at each emission color. Applying voltage to the OLED device, holes and electrons are injected from the anode and the cathode, respectively, and form excitons in the emission layer. Then these excitons recombine and release their energy as emission of light.

As one of problems involved in the development of an OLED device, there is a need for an improvement of its emission efficiency. The OLED device generally has a structure in which functional layers including a emission layer are stacked one-dimensionally. In this case, the refractive index (approximately 1.7 to 1.9) of the emission layer is larger than that of the air. Therefore, a majority of light emitted from an inside of the emission layer are totally reflected at an interface of a stacked film at which a high refractive index changes to a low refractive index. The totally reflected light becomes guided-wave light propagating in a horizontal direction (in-plane direction) of a substrate, and then is confined inside the OLED device. A ratio (light extraction efficiency) of light extracted outside the OLED device to the light generated inside the emission layer is generally only approximately 20%. Therefore, in order to improve the emission efficiency of the OLED device, it is important to improve the light extraction efficiency. Japanese Patent Application Laid-Open No. H11-283751 proposes a method of arranging a periodic structure (diffraction grating) in an upper part or a lower part (light extraction side or side opposite thereto) of an organic layer in order to prevent total reflection and suppress optical confinement in a device.

However, in the above-mentioned conventional OLED device, for example, an interference effect of light in a direction perpendicular to a substrate, which is generated by a reflection electrode, is impaired due to an arrangement of the periodic structure, unfortunately leading to a decrease in light extraction efficiency depending on the arrangement of the periodic structure.

DISCLOSURE OF THE INVENTION

An object of the present invention is to improve light extraction efficiency of a light emitting device.

Specifically, the light emitting device includes:
a first electrode;
a second electrode provided on a light extraction side;
an emission layer formed between the first electrode and the second electrode;
a reflection surface located on the first electrode side with respect to the emission layer; and
a periodic structure for diffracting light generated in the emission layer and guided in an in-plane direction of the light emitting device to the light extraction side,
wherein the periodic structure is a fixed end, and is formed at a node of interference generated by light emitted from the emission layer and light emitted from the emission layer to the reflection surface side and reflected on the reflection surface.

Further features of the present invention will become apparent from the following description of exemplary embodiments with reference to the attached drawings.

BEST MODE FOR CARRYING OUT THE INVENTION

Hereinafter, a principle of the present invention will be described based on structural examples.

In the present invention, in order to improve light extraction efficiency of an OLED device, a periodic structure is formed at a node of interference generated by light emitted from an emission layer and light traveling in a direction from the emission layer to a first electrode and reflected on a reflection surface. The periodic structure is a structure for extracting light, which is generated in the emission layer and guided in an in-plane direction of the light emitting device, to the outside of the light emitting device. For example, as will be described in the embodiment below, the periodic structure includes a structure in which metal films are periodically provided in a light transmission member or a structure in which opening portions are periodically provided in a metal film. The reflection surface used herein is a reflection surface having a reflectance of 50% or more at a peak wavelength of a spectrum of light extracted to the outside of the light emitting device, such as a reflection surface generated at an interface between a reflection member such as metal or a light transmission member, or a reflection surface in which multiple light transmission members having different refractive indices are stacked.

The present invention is characterized in that the periodic structure is formed at the node of interference generated by the light emitted from the emission layer and the light traveling in the direction from the emission layer to the first electrode and reflected on the reflection surface. The node of interference used herein is a position in which interference effect of light is the smallest. When the periodic structure is provided at the node of interference, there is less effect of the periodic structure on the interference generated by the light emitted from the emission layer and the light traveling in the direction from the emission layer to the first electrode and reflected on the reflection surface. Accordingly, the improvement in light extraction efficiency by interference can be compatible with the improvement in light extraction efficiency by the periodic structure, which leads to a dramatic improvement in light extraction efficiency.

Figure 1:
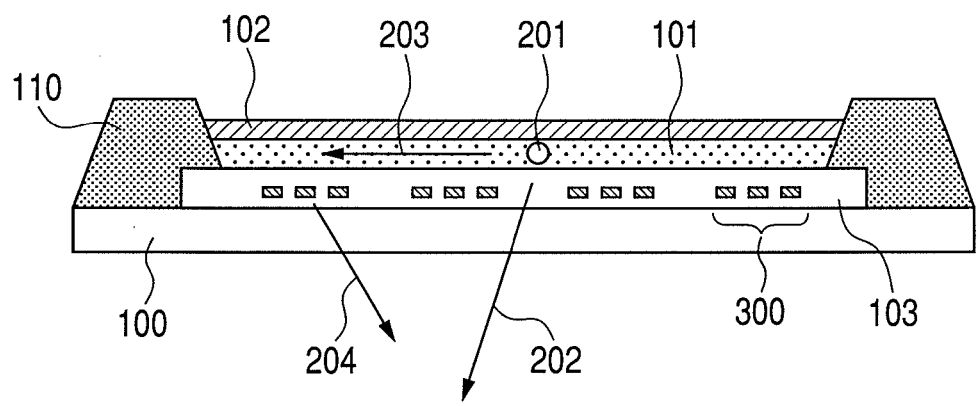
FIG. 1 is a schematic sectional view of an OLED device having a periodic structure at a node of interference generated by a reflection surface.
Figure 2:
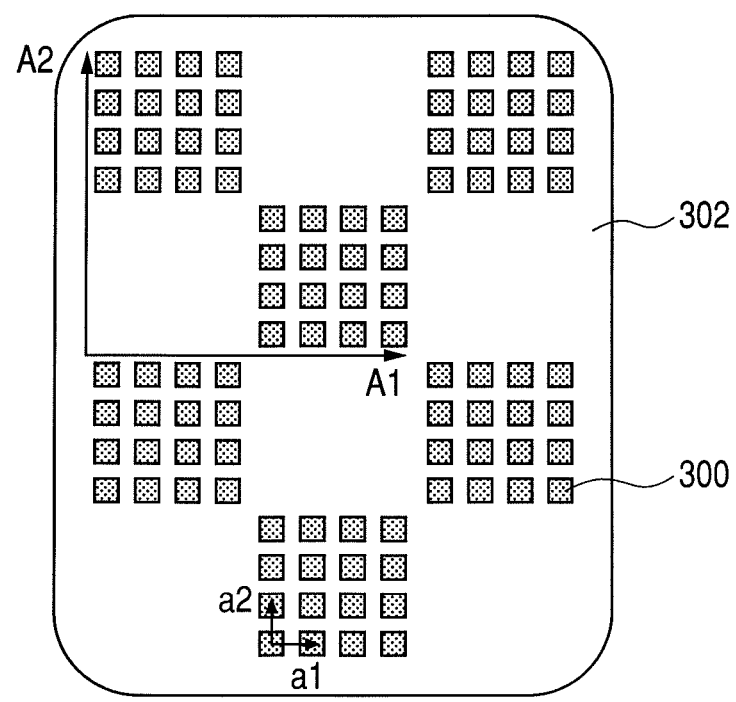
FIG. 2 is a schematic plane view of the OLED device having the periodic structure at the node of interference generated by the reflection surface.

FIG. 1 is a schematic sectional view of an OLED device in which the periodic structure is formed at the node of interference, and FIG. 2 is a plane view thereof. It should be noted that the OLED device is illustrated in FIGS. 1 and 2, but even in a case of an inorganic EL device or a quantum dot (QD)-LED device in which QD is used for an emission layer, the present invention can be embodied.

In the OLED device (light emitting device) illustrated in FIG. 1, a transparent electrode 103 is formed on a substrate 100 as an anode. A periodic structure 300 is formed within the transparent electrode 103. In this embodiment, the transparent electrode 103 corresponds to a second electrode on a light extraction side. Further, a device separation layer 110 made of an insulating member is formed so as to cover a perimeter of the anode. On an exposed portion of the anode, which is exposed from an opening portion of the device separation layer 110, an organic layer 101 including the emission layer is stacked, and a reflection electrode 102 serving as a cathode is formed. In this embodiment, the reflection electrode 102 corresponds to a first electrode. In other words, the OLED device according to this embodiment is an example of a bottom-emission light emitting device in which light is extracted from the substrate 100 side. It should be noted that a light emission point is denoted by reference numeral 201, propagating light is denoted by reference numeral 202, guided-wave light is denoted by reference numeral 203, and diffraction light is denoted by reference numeral 204.

The periodic structure 300 is formed of metal in this structural example, and as illustrated in FIG. 2, includes both a photonic crystal structure (periodic structure 300) portion and a flat portion within an emission region 302. It should be noted that the light emitting region (emission region) 302 of FIG. 2 corresponds to a portion, on which the transparent electrode 103, the organic layer 101, and the reflection electrode 102 of FIG. 1 are stacked.

Figure 3:
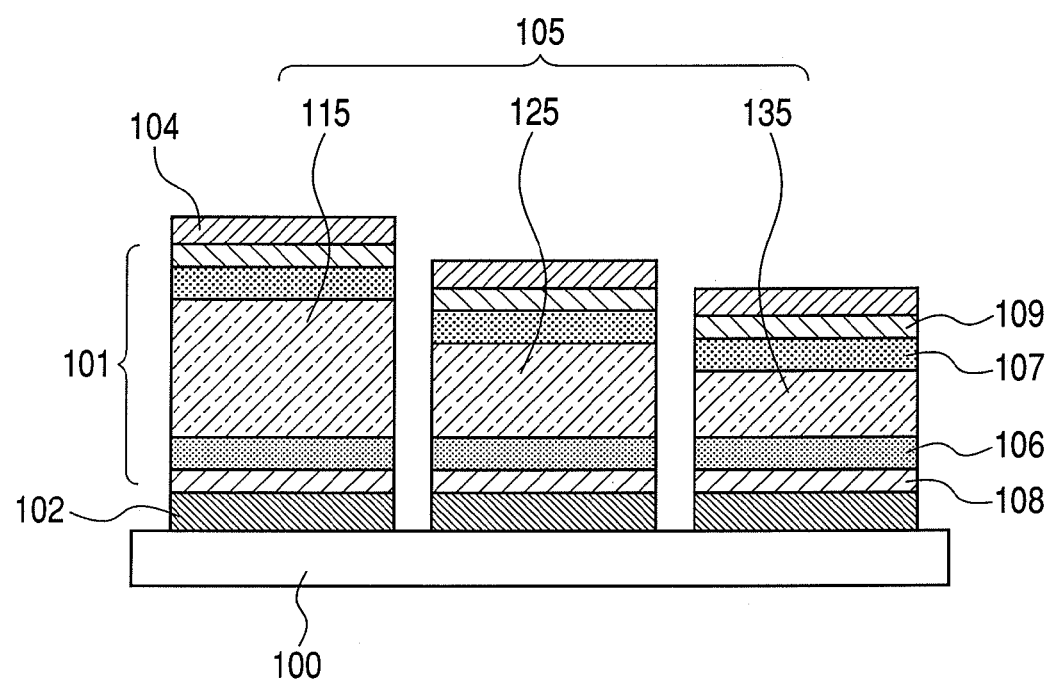
FIG. 3 is a schematic sectional view of an organic layer.

As illustrated in FIG. 3, the organic layer 101 normally has a structure in which hole transport layers 106, emission layers 105 (R-emission layer 115, G-emission layer 125, and B-emission layer 135), and electron transport layers 107 are stacked. Each of the emission layers 105 contains more than one fluorescent or phosphorescent organic compound, which corresponds to each emission color. If necessary, a hole injection layer 108 may be interposed between the anode and the hole transport layer 106, and an electron injection layer 109 may be formed between the cathode and the electron transport layer 107. In FIG. 3 and thereafter, the same components are denoted by the same reference numerals of FIG. 1.

When those OLED devices are applied with a voltage, a hole injected from the anode and an electron injected from the cathode are recombined in the emission layer of the organic layer 101, and form an exciton to emit light.

In the structural example illustrated in FIG. 1, an interface between the organic layer 101 and the reflection electrode 102 is the reflection surface. With respect to the light emission point 201, the transparent electrode 103 side (second electrode side) is a light extraction side, and a reflection electrode side (first electrode side) is a reflection surface side. However, the structure of the present invention is not limited to the structure in which the reflection surface is formed at the interface between the organic layer and the electrode. The first electrode on the reflection surface side may be formed of a light transmission member, a metal layer, or a stacked layer thereof. In the case where the first electrode is formed of the light transmission member, the metal layer is disposed by sandwiching a light transmissive dielectric between the metal layer and the light transmission member, and the reflection surface is formed at an interface between the metal layer and the dielectric. In the case where the first electrode is formed of the stacked layer of the light transmission member and the metal layer, their interface is the reflection surface.

If the reflection surface is provided, interference is generated by superposing light entering to the reflection surface from the emission layer and light reflected on the reflection surface. The emission layer is formed at an antinode of the thus generated interference. When the emission layer is formed at the antinode of interference, interference effect is generated between the light emitted from the emission layer to the light extraction side and the light emitted from the emission layer to the reflection surface side and reflected on the reflection surface. In other words, the antinode of interference is a position in which interference effect of light is the largest.

It should be noted that the formation of the emission layer at the antinode of interference means that a light emitting position located within the emission layer is in the vicinity of the antinode of interference. The light emitting position is desirably located at the antinode of interference. However, in the case where a spectrum peak wavelength of the light emitted from the emission layer is different from a spectrum peak wavelength of the light to be extracted, the light emitting position and the antinode of interference may be deviated from each other. Specifically, it is sufficient that a difference between the light emitting position and the antinode of interference in a film thickness direction be $\lambda/8n$ or less. Emission intensity is distributed in the film thickness direction, and in the present invention, the light emitting position is defined as a position in which the emission intensity reaches its peak in the film thickness direction. A major factor to determine the light emitting position is balance of injecting a carrier to the emission layer, that is, balance between electron injection characteristics and hole injection characteristics, and carrier mobility of a material used for the emission layer. In the case where the balance of injecting a carrier is nearly uniform, the carrier mobility is the major factor.

In this case, if electron mobility is larger than hole mobility, a position located in the vicinity of the interface on the anode side of the emission layer is the light emitting position, while if the hole mobility is larger than the electron mobility, a position located in the vicinity of the interface on the cathode side of the emission layer is the light emitting position.

On the other hand, in the present invention, the periodic structure 300 is formed at the node of interference. The formation of the periodic structure at the node of interference means that a center of the periodic structure in the film thickness direction is located in a position in the vicinity of the node of interference. The position in the vicinity of the node of interference means that a difference between the center of the periodic structure in the film thickness direction and the node of interference is $\lambda/8n$ or less, which will be described below. When the difference falls within the above-mentioned range, there is less effect of the periodic structure on the interference generated by the light emitted from the emission layer to the light extraction side and the light emitted from the emission layer to the reflection surface side and reflected on the reflection surface, with the result that the periodic structure can be compatible with the interference to dramatically enhance light extraction efficiency.

In general, in the OLED device, a refractive index (about 1.7 to 1.9) of the emission layer is larger than a refractive index 1.0 of air outside the OLED device. Therefore, in the case where the periodic structure 300 is not provided, most of the light emitted from the light emission point 201 is confined in the OLED device as the guided-wave light 203 in a direction parallel to the substrate (in-plane direction) by total reflection. A ratio of light extracted outside the OLED device as the propagating light 202 to the light generated inside the emission layer is no more than about 20%.

Contrary to this, in the case where the periodic structure 300 is arranged as illustrated in FIG. 1, a part of the guided-wave light 203 is converted into the diffraction light 204 by the periodic structure 300 and is extracted out of the OLED device. Owing to the above-mentioned diffraction effect, emission efficiency is improved.

However, in the case where the periodic structure is formed in the OLED device including the reflection surface, emission efficiency varies depending on an optical path length between the periodic structure and the reflection surface. When the periodic structure is formed at the node of interference generated by the reflection surface, emission efficiency is improved. On the other hand, when the periodic structure is formed at the antinode of interference generated by the reflection surface, emission efficiency is decreased.

Figure 4:
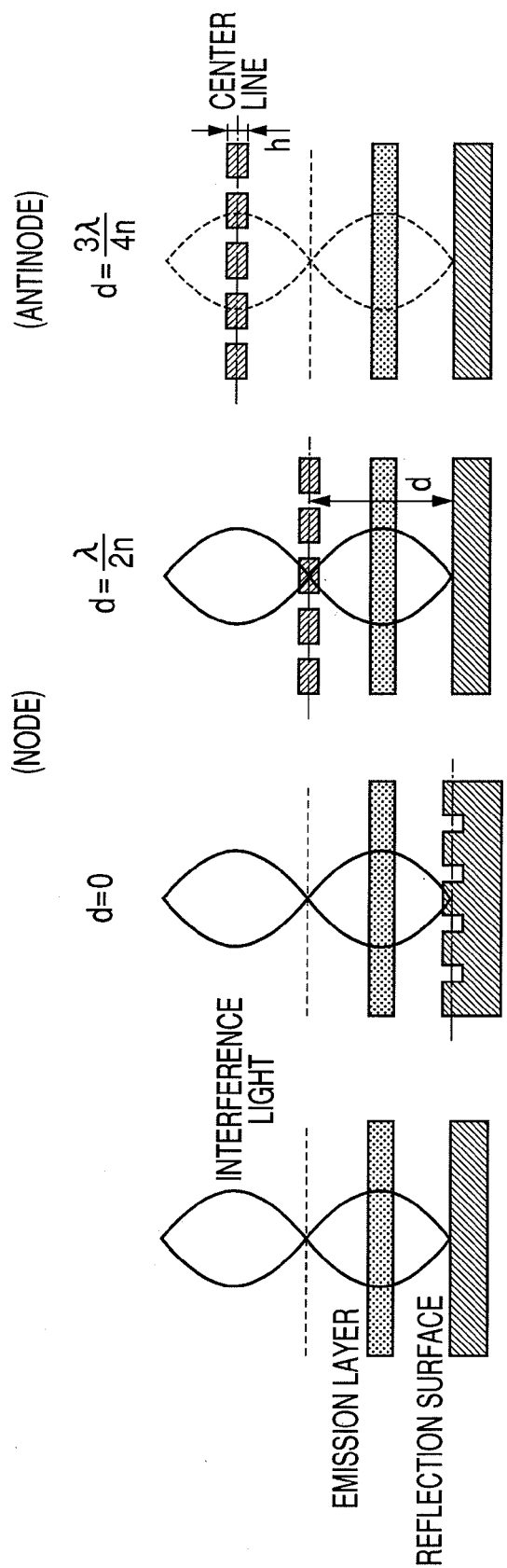
FIGS. 4A, 4B, 4C and 4D are pattern diagrams illustrating a positional relationship between the interference generated by the reflection surface and the periodic structure.

For an explanation of the phenomenon described above, FIGS. 4A, 4B, 4C and 4D are conceptual views illustrating a positional relationship between interference generated by the reflection surface and the periodic structure. As a comparative example, FIG. 4A schematically illustrates interference (interference light) generated by a flat reflection surface. When the emission layer is arranged at the antinode of interference, light emission is enhanced by interference effect. Here, it is considered to arrange the periodic structure in which a boundary condition of the fixed end is set, such as a periodic metal structure or a periodic structure of a high refractive index material formed in a low refractive index material, in the above-mentioned structure. FIGS. 4B and 4C illustrate, as the structural examples of the present invention, examples in which the periodic structure is provided at the node of interference. FIG. 4B is an example in which the periodic structure is provided in the reflection surface, and FIG. 4C is an example in which the periodic structure is provided in a position apart from the reflection surface. When the periodic structure is provided at the node of interference as illustrated in FIGS. 4B and 4C, it is possible to convert the guided-wave light in a direction parallel to the substrate into diffraction light and to extract the diffraction light out of the OLED device while roughly maintaining interference effect of light in a direction perpendicular to the substrate. Therefore, light extraction efficiency is improved. In contrast, when the periodic structure is formed at the antinode of interference as illustrated in FIG. 4D, interference effect is impaired to decrease emission efficiency.

Figure 5:
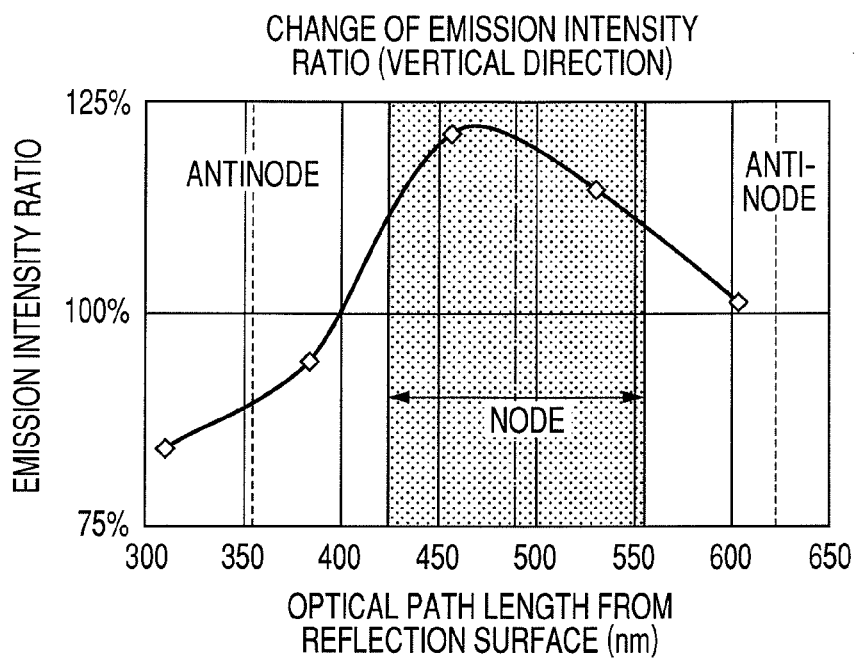
FIG. 5 is a graph of an example of a calculation result illustrating a relationship between an optical path length and emission intensity between the periodic structure and the reflection surface.

As a specific example, FIG. 5 illustrates a graph in which a relationship between the optical path length and emission intensity ratio between the periodic structure and the reflection surface is evaluated by numerical calculation. The emission intensity ratio is represented by a value in a vertical direction, and the case devoid of the periodic structure is set as the reference. In the numerical calculation of an electromagnetic wave, an FDTD method was used in consideration of a cross section of the OLED device. The calculation was performed with the wavelength range λ of 380 nm to 780 nm at 5 nm intervals and in the electromagnetic wave modes of a TE mode and a TM mode.

In FIG. 5, a shaded region illustrates a range of the optical path length in the case where the periodic structure is located at the node of interference. Other region illustrates a range of the optical path length in the case where the periodic structure is located at the antinode of interference. It is revealed from FIG. 5 that, when the periodic structure is formed at the node of interference, the emission intensity is improved compared with the case of the OLED device devoid of the periodic structure. On the other hand, when the periodic structure is formed at the antinode of interference, the emission intensity is decreased compared with the case of the OLED device devoid of the periodic structure.

Therefore, in order to improve the emission efficiency, the periodic structure is formed at the node of interference generated by the reflection surface in the present invention. As a result, the emission efficiency of the light emitting device can be improved.

Alternatively, in the case where the periodic structure in which a boundary condition of the free end is set, such as the periodic structure of a low refractive index material formed in a high refractive index material, is arranged, the periodic structure is desirably formed at the antinode of interference.

Hereinafter, a more detailed description is given.

The condition for forming the periodic structure having a fixed end at the node of interference generated by the reflection surface is given by Formula 1 where: λ represents a peak wavelength of a spectrum of light to be extracted; d represents a distance between the periodic structure and the reflection surface; and n represents an average refractive index between the periodic structure and the reflection surface. In this case, $\phi_m$ represents a phase shift of the reflection surface, and m represents an integer. Besides, the distance d and the average refractive index n are expressed by $d=\Sigma d_i$ and $n=\Sigma n_i d_i/d$, respectively, when $d_i$ and $n_i$ represent a thickness of each layer i and the refractive index between the periodic structure and the reflection surface, respectively.

$$m + \frac{1}{4} < \frac{2nd}{\lambda} + \frac{\phi_m}{2\pi} < m + \frac{3}{4} \quad \text{(Formula 1)}$$

Figure 6:
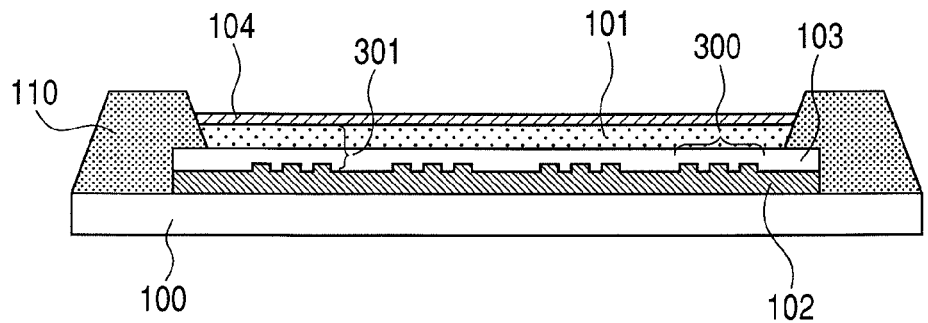
FIG. 6 is a schematic sectional view of an OLED device having a convex periodic structure on the reflection surface.

In the case where the reflection surface is made of metal, the condition is from $\phi_m$ to $-\pi$. As in FIG. 4B, in the case where the periodic structure is formed at the node of interference, which is in contact with the reflection surface, the condition corresponds to a case where m=−1. FIG. 6 illustrates a top emission structure in which a side opposite to the substrate of the emission layer is a light extraction side. In the structural example of FIG. 6, an interface between the reflection electrode 102 made of metal and the transparent electrode 103 formed on the reflection electrode 102 is the reflection surface, and the periodic structure 300 is formed on the reflection surface, which is the case where m=−1. It should be noted that an optical waveguide is denoted by reference numeral 301. As in FIG. 4C, in the case where the periodic structure is located at the node of interference, which is apart from the reflection surface, the condition corresponds to a case where m≧0. The structural example of FIG. 1 is the case where m≧0.

In the case where the reflection surface is made of metal, the condition is from $\phi_m$ to $-\pi$.

Further, the optical path length varies for each position of the periodic structure according to irregularities thereof in its height direction, which has effects on interference generated by the reflection surface. Thus, in order to maintain interference effect more sufficiently, Formula 1 needs to be satisfied in any region of the irregularities of the periodic structure, which is given by a conditional expression of Formula 2 where h represents a height of the periodic structure in a direction perpendicular to the substrate surface. Therefore, the height h of the periodic structure is desirably kept to be less than an upper limit λ/(4n).

$$h < \frac{\lambda}{4n} \quad \text{(Formula 2)}$$

In the OLED device, the average refractive index n is about 1.5 to 2.0, and the emission wavelength λ in a visible range is 380 nm to 780 nm, and hence the height of the periodic structure is desirably less than 130 nm. In the case where the height of the periodic structure is common to a red light emitting device, a green light emitting device, and a blue light emitting device (hereinafter, referred to as R-device, G-device, and B-device, respectively), a condition of Formula 3 needs to be satisfied in the blue (B) device having the smallest wavelength, and thus the height of the periodic structure is desirably less than 60 nm. In the case where the height of the periodic structure is common to the R-device, the G-device, and the B-device, the periodic structures thereof can be formed collectively. Further, for preventing disconnection of the emission layer to prevent current leakage or uneven emission, the emission layer needs to be planarized, and for planarizing the emission layer, the height of the periodic structure is more desirably less than 30 nm. In particular, a problem such as current leakage or uneven emission caused by the disconnection of the organic layer (emission layer) is conspicuous in the OLED device, and hence the height of the periodic structure is desirably made low.

However, the periodic structure is desirably formed on a position closer to the substrate side with respect to the emission layer, that is, between the emission layer and the substrate. This is because, in the case where the periodic structure is formed on the light extraction side of the emission layer, the problem of disconnection of the emission layer, which stems from the periodic structure, is solved, but it is difficult to form the periodic structure without affecting the emission layer (organic layer).

As illustrated in FIG. 2, in the structural example of this embodiment, the emission region 302 includes the regions in which the periodic structures 300 are provided and the regions in which the periodic structures 300 are not provided. Assume that two primitive translation vectors for specifying the period of the periodic structures 300 are expressed by $a_1$ and $a_2$. Assume that primitive reciprocal vectors satisfying a relationship of Formula 3 with respect to the primitive translation vectors $a_1$ and $a_2$ are expressed by $b_1$ and $b_2$. The example of FIG. 2 illustrates the layered structure in which the regions in which the periodic structures 300 are provided and the regions in which the periodic structures 300 are not provided are arranged at a larger period. Two primitive translation vectors for specifying the larger period are expressed by $A_1$ and $A_2$. In the case of FIG. 2, the periodic structure 300 has four-fold symmetry so as to have the same viewing angle characteristics in vertical and horizontal directions of the light emitting device. In the case where the light emitting device according to the present invention is used in a display apparatus, primitive translation vector directions of the periodic structure are desirably caused to correspond to the vertical direction and the horizontal direction of the display region so that the viewing angle characteristics are the same in the vertical direction and the horizontal direction of the display apparatus.

$$a_i \cdot b_j = 2\pi \delta_{ij} (i,j=1,2) \quad \text{(Formula 3)}$$

In order to enhance diffraction effects owing to the periodic structure, more desirably, a period of the periodic structure is set. Hereinafter, the period of the periodic structure will be described.

Assume that an emission peak wavelength of the emission layer of the organic layer 101 is expressed by λ and a wave number is expressed by "k=2π/λ". Assume that a refractive index of the emission layer is expressed by "n", a refractive index of a medium (air in general) located on the light extraction side is expressed by $n_{ext}$, and a condition of $n > n_{ext}$ is satisfied.

Assume that a propagation coefficient in the horizontal direction of the substrate 100 with respect to the guided-wave light 203 propagating through the optical waveguide 301 is expressed by β, and an effective refractive index $n_{eff}$ and an effective absorption coefficient $K_{eff}$ with respect to the guided-wave light 203 are defined by Formula 4. The effective refractive index $n_{eff}$ satisfies a condition of $n_{ext} < n_{eff} < n$.

$$\beta = (n_{eff} + i\kappa_{eff})k \quad \text{(Formula 4)}$$

In this case, a diffraction condition is obtained by Formula 5 based on a phase matching condition in the horizontal direction under the condition of $n_{ext} < n_{eff} < n$ on the assumption that two integers $m_1$ and $m_2$ denote diffraction orders and θ denotes the diffraction angle relative to the direction of the normal to the substrate.

$$n_{eff} - n_{ext}\sin\theta = \frac{\lambda}{2\pi}|m_1 b_1 + m_2 b_2| \quad \text{(Formula 5)}$$

In a case of a square lattice, when the period is expressed by "a", the primitive translation vectors are obtained by Formula 6 and the primitive reciprocal vectors are obtained by Formula 7.

$$a_1 = \begin{pmatrix} a \\ 0 \end{pmatrix}, \quad a_2 = \begin{pmatrix} 0 \\ a \end{pmatrix} \quad \text{(Formula 6)}$$

$$b_1 = \frac{2\pi}{a}\begin{pmatrix} 1 \\ 0 \end{pmatrix}, \quad b_2 = \frac{2\pi}{a}\begin{pmatrix} 0 \\ 1 \end{pmatrix} \quad \text{(Formula 7)}$$

In this case, the diffraction condition of Formula 5 is expressed by Formula 8.

$$n_{eff} - n_{ext}\sin\theta = \frac{\sqrt{m_1^2 + m_2^2}}{a}\lambda \quad \text{(Formula 8)}$$

Here, attention is focused on any one of the one-dimensional directions, and it is assumed that $m_2=0$ (or $m_1=0$) and $|m_1|=m>0$ ($|m_2|=m>0$). In this case, a diffraction condition of Formula 8 is simplified to Formula 9. Further, as in the case of the OLED device, in the case where the relationship of $3n_{ext} \geq n\, n_{eff}$ is satisfied, the diffraction condition for generating only the first-order diffraction light of m=1 is represented by Formula 10.

$$n_{eff} - n_{ext}\sin\theta = m\frac{\lambda}{a} \quad \text{(Formula 9)}$$

$$\frac{\lambda}{n + n_{ext}} < a < \frac{\lambda}{n_{ext}} \quad \text{(Formula 10)}$$

In order to enable control of light emission pattern, efficiency, or chromaticity of the OLED device, only the first-order diffraction light is desirably generated, and the mode number of the guided-wave light is desirably decreased. In the OLED device, generally, the refractive index n of the emission layer is about 1.6 to 2.0, and the refractive index $n_{ext}$ on the light extraction side is 1.0. Therefore, from Formula 10, in the case where only the first-order diffraction light is mainly used, desirably, a period a of the periodic structure 300 is roughly 0.33 times or more to 1.0 time or less of the emission peak wavelength λ. Since the wavelength range of the visible light is 380 nm or more to 780 nm or less, the period a of the periodic structure 300 is desirably 125 nm or more to 780 nm or less. In order that the period of the periodic structure satisfy Formula 10 in each of the R-device, the G-device, and the B-device, the period is desirably made to be the largest in the R-device, and the smallest in the B-device.

The structure has been described in which the anode is located on the substrate side and the cathode is located on the light extraction side. However, even in a case of a structure in which the cathode is located on the substrate side, the anode is located on the light extraction side, and the hole transport layer, the emission layer, and the electron transport layer are stacked in the reverse order, the present invention can be embodied. Therefore, the light emitting device according to the present invention is not limited to the structure in which the anode is located on the substrate side and the cathode is located on the light extraction side.

A low-molecular material, a polymer material, or a combination thereof is used as an organic compound for each of the hole transport layer 106, the emission layer 105, the electron transport layer 107, the hole injection layer 108, and the electron injection layer 109 as illustrated in FIG. 3. Therefore, the organic compound is not particularly limited. If necessary, an inorganic compound or quantum dot (QD) may be used.

Figure 7:
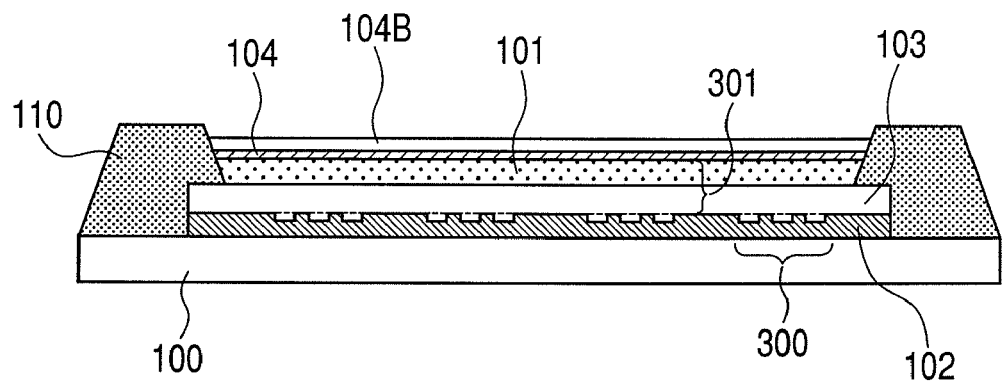
FIG. 7 is a schematic sectional view of an OLED device having a concave periodic structure in the reflection surface.

As described above, each of the periodic structures 300 is not limited to the two-dimensional photonic crystal structure, and thus may be a combination of one-dimensional diffraction gratings or a three-dimensional photonic crystal structure. Although the concave photonic crystal structure is illustrated in FIG. 6, a convex photonic crystal structure as illustrated in FIG. 7 may be used.

Figure 8:
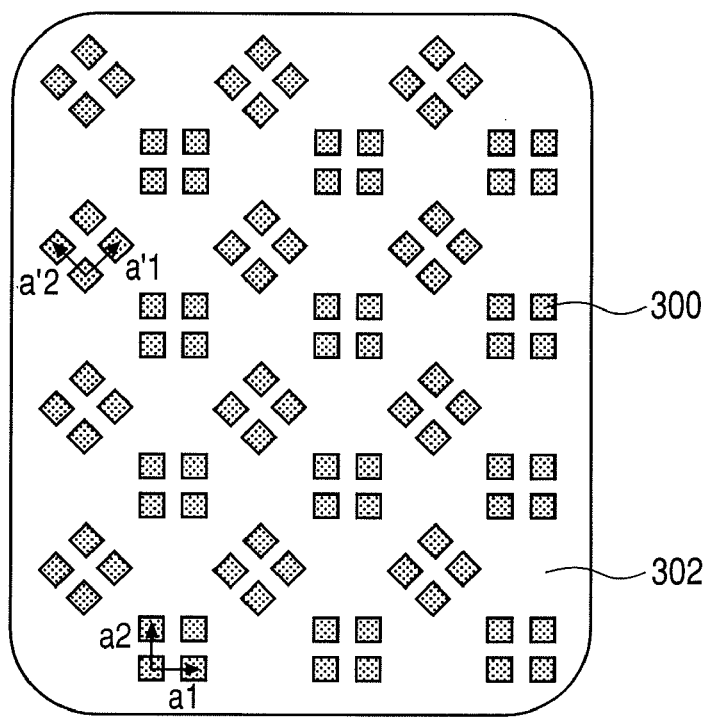
FIG. 8 is a schematic plan view of an OLED device having the periodic structure at the node of interference generated by the reflection surface.

As illustrated in FIG. 8, the plurality of kinds of periodic structures 300 having different primitive translation vectors may be provided. The emission region is denoted by reference numeral 302. FIG. 8 illustrates an example in which the periodic structures having the primitive translation vectors $a_1$ and $a_2$ and periodic structures having primitive translation vectors $a'_1$ and $a'_2$ are combined. Note that $a'_1$ denotes a vector in a $(a_1+a_2)/\sqrt{2}$ direction and $a'_2$ denotes a vector in a $(-a_1+a_2)/\sqrt{2}$ direction. In other words, periodic structures-1 having four-fold symmetry and periodic structures-2 obtained by rotating the periodic structures-1 by 45° are combined. When the periodic structures are arranged as illustrated in FIG. 8, not only the viewing angle characteristics of the light emitting device in the up and down direction and the right and left direction but also viewing angle characteristics of the light emitting device in oblique directions can be made equal to one another. In the same manner, when N denotes a natural number, periodic structures-1 having N-fold symmetry and periodic structures-2 obtained by rotating the periodic structures-1 by 180°/N can be combined.

Each of the periodic structures 300 is not necessarily completely periodic and thus may be a quasi-crystalline structure, a fractal structure, a structure whose period continuously changes, a structure containing an irregular defect in a periodic structure, or a combination of the periodic structure and any of the structures.

Further, a description has been given of the bottom emission structure in which the substrate side is the light extraction side. However, the present invention is also applicable to the top emission structure in which the side opposite to the substrate is the light extraction side. FIGS. 6 and 7 illustrate the case where the periodic structure is formed on the reflection surface located on an opposite side to the light extraction side with respect to the emission layer. In other words, FIGS. 6 and 7 illustrate the top emission structure in which the reflection electrode 102 having the periodic structure 300 and the transparent electrode 103 formed on the reflection electrode 102 are formed on the substrate 100, and the organic layer 101 and the transparent electrode 104 are stacked on the transparent electrode 103.

In FIG. 6, surface plasmon which may be considered as a kind of guided-wave light is generated. The surface plasmon propagates through, in the horizontal direction of the substrate, an interface (metal reflection surface) between the reflection electrode 102 made of metal and the transparent electrode 103B which is assumed to be a dielectric in the visible light wavelength region and located on the reflection electrode. Therefore, the interface between the reflection electrode 102 and the transparent electrode 103B located on the reflection electrode can be used as the optical waveguide. When a propagation coefficient $\beta_{sp}$ of the surface plasmon is set as the propagation coefficient β of Formula 4, the diffraction condition is expressed by Formula 5 as in the case of the normal guided-wave light. The interface in which the surface plasmon is generated is not limited to the interface between the metal layer and the transparent electrode. An interface between the metal layer and the organic layer or an interface between the metal layer and the dielectric layer can be also used as the optical waveguide.

The light emitting device according to the present invention can be applied to various uses for a display apparatus, lighting, back lighting for a display apparatus, and the like. The display apparatus includes a television set, a display of a personal computer, a back display part of an imaging apparatus, a display part of a cellular phone, a display part of a portable music player system, a display part of a personal digital assistant (PDA), a display part of a portable game console, and a display part of a car navigation system.

Hereinafter, a method of manufacturing the light emitting device according to the present invention will be described as examples, but the present invention is not limited by the examples described below.

Example 1

The OLED device illustrated in FIG. 1 is manufactured by the method described below. That is, the light emitting device according to Example 1 of the present invention includes an emission layer between the first electrode and the second electrode on a light extraction side, and the reflection surface is formed on the first electrode side with respect to the emission layer.

First, as the transparent electrode 103, ITO is formed to have a film thickness of 70 nm through sputtering on the substrate 100.

Next, the periodic structure 300 made of Al is formed through a lift-off process. First, a positive type resist is spin-coated and is pre-baked on the transparent electrode 103. Then, the resist is exposed to a periodic structure pattern of a square lattice as illustrated in FIG. 2, and developing and post-baking are performed, to thereby form a resist pattern. In Example 1 of the present invention, the periodic structure 300 has a period of 240 nm, and one side length thereof is 100 nm. Further, a portion including the periodic structure 300 and a flat portion are alternately arranged every ten periods. Then, a film made of Al is formed with a film thickness of 30 nm through evaporation. The film made of Al is formed on ITO in the exposed portion, and the film made of Al is formed on the resist in a portion other than the exposed portion. After that, the resist is peeled off and is removed together with the film made of Al formed thereon, whereby the periodic structure 300 made of Al is formed. On the periodic structure 300, a film made of ITO is formed to have a film thickness of 150 nm through sputtering, and an electrode thereof is patterned, with the result that an anode with a photonic crystal is formed.

In the square lattice as illustrated in FIG. 2, the periods (arrangements) of the periodic structure 300 in the light emitting device in the up and down direction and the right and left direction are equal to each other. Therefore, when the light emitting device is visually recognized, the same optical characteristics can be obtained in the up and down directions and the right and left directions to improve visibility. Alternatively, a rectangular lattice whose periods in the up and down direction and the right and left direction are different from each other may be used. In this case, the visibility can be adjusted according to the direction. Further, when different square lattices are combined as illustrated in FIG. 8, the same optical characteristics can be obtained in the up and down directions, the right and left directions, and the oblique directions to improve the visibility.

The device separation layer 110 made of silicon nitride oxide ($SiN_xO_y$) is formed at a thickness of 320 nm. Then, an opening portion serving as the emission region is formed for each sub-pixel by etching to manufacture an anode substrate in which photonic crystals are arranged.

The anode substrate is subjected to ultrasonic cleaning with isopropyl alcohol (IPA), subjected to boil washing, and then dried. After that, UV/ozone cleaning is performed and the organic layer 101 is formed by vacuum evaporation.

First, a film of Compound (I) expressed by the following structural formula is formed as a hole transport layer at a thickness of 70 nm. In this case, a degree of vacuum is $1\times10^{-4}$ Pa and an evaporation rate is 0.2 nm/sec.

Compound (I)

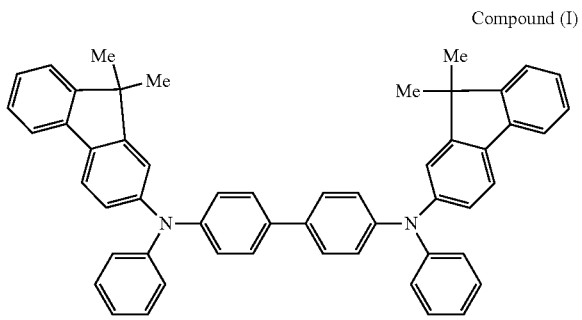

Next, an emission layer is formed. The emission layer is formed at a thickness of 25 nm by co-evaporation using tris-(8-hydroxyquinoline) aluminum (hereinafter referred to as Alq3) as host and light emitting compound 3-(2'-benzothiazolyl)-7-N,N-diethylaminocoumarin (hereinafter referred to as coumarin-6). A degree of vacuum during evaporation is $1\times10^{-4}$ Pa and a film formation rate is 0.2 nm/sec.

Then, an electron transport layer is formed at a thickness of 10 nm by vacuum evaporation using 1,10-bathophenanthroline (hereinafter referred to as BPhen). A degree of vacuum during evaporation is $1\times10^{-4}$ Pa and a film formation rate is 0.2 nm/sec. Then, an electron injection layer is formed at a thickness of 25 nm by co-evaporation using BPhen and $Cs_2CO_3$ (weight ratio 90:10). A degree of vacuum during evaporation is $3\times10^{-4}$ Pa and a film formation rate is 0.2 nm/sec.

The substrate on which the formation of the electron injection layer is finished is moved to a sputtering apparatus without breaking a vacuum, and a film made of an Ag alloy is formed as the reflection electrode 102 to have a film thickness of 200 nm through sputtering. The reflection electrode 102 made of an Ag alloy is a high reflection electrode having a spectral reflectance of 80% or more in a wavelength range ($\lambda$=380 nm to 780 nm) of visible light. In addition to an Ag alloy, Al or an Al alloy can be used.

Further, a hygroscopic agent is placed in a perimeter of the light emitting device, and is sealed with etched cap glass, to thereby obtain an OLED device. In other words, the periodic metal structure is arranged at the node of interference generated by the reflection surface.

Comparative Example 1

First, on the substrate 100, a film made of ITO is formed to have a film thickness of 190 nm as the transparent electrode 103 through sputtering, and the transparent electrode 103 is patterned, thereby forming an anode. The process after the formation of the device separation layer 110 is the same as that of Example 1. In other words, the structure devoid of the periodic structure is made.

Comparative Example 2

First, on the substrate 100, a film made of ITO is formed as the transparent electrode 103 to have a film thickness of 140 nm through sputtering. The process until the formation of the periodic structure 300 made of Al is the same as that of Example 1. On the transparent electrode 103, a film made of ITO is formed to have a film thickness of 35 nm through sputtering, and the transparent electrode 103 is patterned, thereby forming an anode with a photonic crystal. The process after the formation of the device separation layer 110 is the same as that of Example 1. In other words, the periodic metal structure is arranged in an antinode region of interference generated by the reflection surface.

Table 1 illustrates evaluation values obtained through numerical calculation of emission intensity ratio (in a vertical direction) of Example 1, Comparative Example 1, and Comparative Example 2. It is revealed that the emission intensity ratio of Example 1 is about 1.2 times the emission intensity ratio of Comparative Example 1, and that light extraction efficiency is improved in Example 1.

The reason why the light extraction efficiency of Example 1 is improved is that the periodic structure has little effect on the interference generated by the light travelling in the direction from the emission layer to the transparent electrode and the light travelling in the direction from the emission layer to the reflection electrode and reflected on the reflection surface. Accordingly, the improvement in light extraction efficiency by the interference can be realized together with the improvement in light extraction efficiency by the periodic structure, with the result that the light extraction efficiency is improved compared with Comparative Example 1. In Comparative Example 2, the periodic structure has effects on the interference generated by the light travelling in the direction from the emission layer to the transparent electrode and the light travelling in the direction from the emission layer to the reflection electrode and reflected on the reflection surface, whereby the light extraction efficiency is decreased compared with Comparative Example 1.

TABLE 1

| | Emission intensity ratio |
|---|---|
| Example 1 | 1.21 |
| Comparative Example 1 | 1 |
| Comparative Example 2 | 0.84 |

Example 2

An OLED device having a structure illustrated in FIG. 7 is manufactured by a method described below. A dielectric layer is denoted by reference symbol 104B in FIG. 7.

First, on the substrate 100, a film made of an Ag alloy is formed as the reflection electrode 102 to have a film thickness of about 150 nm through sputtering.

A positive type resist is formed on the reflection electrode 102 by spin coating and then pre-baked. After that, a periodic structure pattern of the square lattice as illustrated in FIG. 2 is exposed on the resist, developed, and post-baked to form a patterned resist.

The periodic structure 300 is formed on the surface of the reflection electrode 102 by etching processing. In Example 2 of the present invention, the periodic structure 300 has 250 nm in period, 140 nm in side length, and 40 nm in etching depth. The region in which the periodic structure 300 is provided and the flat region is alternately arranged at an interval of ten periods.

Next, etched portions of the periodic structure 300 which are concave are planarized by IZO lift-off processing. While the patterned resist is left, an IZO film made of a transparent conductive material is formed at a thickness of 40 nm by sputtering. In the etched portions, a part of the IZO film is formed on the Ag alloy film. In portions except the etched portions, another part of the IZO film is formed on the patterned resist. Then, the patterned resist is removed for planarization with the other part of the IZO film which is located on the patterned resist. After that, an IZO film is formed on the resultant glass substrate at a thickness of 20 nm by sputtering, and then electrode patterning is performed to form an anode with a photonic crystal.

The device separation layer 110 made of silicon nitride oxide ($SiN_xO_y$) is formed at a thickness of 320 nm. Then, an opening portion serving as the emission region is formed for each sub-pixel by etching to manufacture an anode substrate in which photonic crystals are arranged.

The anode substrate is subjected to ultrasonic cleaning with isopropyl alcohol (IPA), subjected to boil washing, and then dried. After that, UV/ozone cleaning is performed and the organic layer 101 is formed by vacuum evaporation.

First, a film of Compound (I) is formed as a hole transport layer at a thickness of 155 nm. In this case, a degree of vacuum is $1\times10^{-4}$ Pa and an evaporation rate is 0.2 nm/sec.

Next, an emission layer is formed. The emission layer is formed at a thickness of 30 nm by co-evaporation using Alq3 as host and light emitting compound coumarin-6. A degree of vacuum during evaporation is $1\times10^{-4}$ Pa and a film formation rate is 0.2 nm/sec.

Then, a common electron transport layer is formed at a thickness of 10 nm by vacuum evaporation using BPhen. A degree of vacuum during evaporation is $1\times10^{-4}$ Pa and a film formation rate is 0.2 nm/sec. Then, a common electron injection layer is formed at a thickness of 30 nm by co-evaporation using BPhen and $Cs_2CO_3$ (weight ratio 90:10). A degree of vacuum during evaporation is $3\times10^{-4}$ Pa and a film formation rate is 0.2 nm/sec.

After the formation of the electron injection layer, the resultant substrate is transferred to a sputtering apparatus without breaking vacuum, and an Ag alloy film having a thickness of 24 nm is formed as the metal translucent electrode 104 by sputtering.

Then, a silica film having a thickness of 290 nm is formed as the dielectric layer 104B by sputtering.

Further, a desiccant is provided in a peripheral portion of the light emitting device. Then, the light emitting device is sealed with an etched cap glass to obtain the OLED device.

Comparative Example 3

The process until the formation of the reflection electrode 102 is the same as that of Example 2. A film made of IZO is formed to have a film thickness of 20 nm through sputtering, and then electrode patterning is performed to form an anode. The process after the formation of a hole transport layer is similar to that of Example 2. In other words, the structure devoid of the periodic structure is made.

Table 2 illustrates evaluation values obtained through numerical calculation of emission intensity ratios (in a vertical direction) of Example 2 and Comparative Example 3. It is revealed that the emission intensity ratio of Example 2 is 1.8 times the emission intensity ratio of Comparative Example 3, and that the emission efficiency is improved in Example 2.

The reason why the light extraction efficiency of Example 2 is improved is that the periodic structure has little effects on the interference generated by the light travelling in the direction from the emission layer to the transparent electrode and the light travelling in the direction from the emission layer to the reflection electrode and reflected on the reflection surface. Accordingly, the improvement in light extraction efficiency by the interference can be compatible with the improvement in light extraction efficiency by the periodic structure, with the result that the light extraction efficiency is improved compared with Comparative Example 3.

TABLE 2

| | Emission intensity ratio |
|---|---|
| Example 2 | 1.78 |
| Comparative Example 3 | 1 |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2007-295974, filed Nov. 14, 2007, 2007-

295591, filed Nov. 14, 2007, and 2007-328709, filed Dec. 20, 2007, which are hereby incorporated by reference herein in their entirety.

The invention claimed is:

1. A light emitting device comprising:
a first electrode;
a second electrode provided on a light extraction side;
an emission layer formed between the first electrode and the second electrode;
a reflection surface located on the first electrode side with respect to the emission layer; and
a periodic structure for diffracting light generated in the emission layer and guided in an in-plane direction of the light emitting device to the light extraction side,
wherein the periodic structure is a fixed end and is formed at a node of interference generated by light emitted from the emission layer to the light extraction side and light emitted from the emission layer to the reflection surface side and reflected on the reflection surface, and
wherein a height h of the periodic structure satisfies:

$$h < \frac{\lambda}{4n}$$

where $\lambda$ represents a peak wavelength of a spectrum of the diffraction light and n represents an average refractive index between the periodic structure and the reflection surface.

2. The light emitting device according to claim 1, wherein a distance d between the periodic structure and the reflection surface and an average refractive index n satisfy:

$$m + \frac{1}{4} < \frac{2nd}{\lambda} + \frac{\phi_m}{2\pi} < m + \frac{3}{4}$$

where $\lambda$ represents a peak wavelength of a spectrum of the diffraction light, $\phi_m$ represents a phase shift at the reflection surface, and m represents an integer.

3. The light emitting device according to claim 1, wherein the periodic structure is formed in a position apart from the reflection surface.

4. The light emitting device according to claim 1, wherein the periodic structure has four-fold symmetry.

5. The light emitting device according to claim 1, wherein a period of the periodic structure is 125 nm or more to 780 nm or less.

6. The light emitting device according to claim 1, wherein the light emitting device comprises an organic electroluminescence device.

7. The light emitting device according to claim 1, wherein the periodic structure is formed of metal.

8. The light emitting device according to claim 1, wherein the periodic structure is a periodic structure of a high refractive index material formed in a low refractive index material.

9. A display apparatus comprising the light emitting device according to claim 1.

10. A light emitting device comprising:
a first electrode;
a second electrode provided on a light extraction side;
an emission layer formed between the first electrode and the second electrode;
a reflection surface located on the first electrode side with respect to the emission layer; and
a periodic structure for diffracting light generated in the emission layer and guided in an in-plane direction of the light emitting device to the light extraction side,
wherein the periodic structure is a fixed end and is formed at a node of interference generated by light emitted from the emission layer to the light extraction side and light emitted from the emission layer to the reflection surface side and reflected on the reflection surface, and
wherein the periodic structure is formed in a position apart from the reflection surface.

11. The light emitting device according to claim 10, wherein a distance d between the periodic structure and the reflection surface and an average refractive index n satisfy:

$$m + \frac{1}{4} < \frac{2nd}{\lambda} + \frac{\phi_m}{2\pi} < m + \frac{3}{4}$$

where $\lambda$ represents a peak wavelength of a spectrum of the diffraction light, $\phi_m$ represents a phase shift at the reflection surface, and m represents an integer.

12. The light emitting device according to claim 10, wherein a height h of the periodic structure satisfies:

$$h < \lambda/4n$$

where $\lambda$ represents a peak wavelength of a spectrum of the diffraction light and n represents an average refractive index between the periodic structure and the reflection surface.

13. The light emitting device according to claim 10, wherein the periodic structure has four-fold symmetry.

14. The light emitting device according to claim 10, wherein a period of the periodic structure is 125 nm or more to 780 nm or less.

15. The light emitting device according to claim 10, wherein the light emitting device comprises an organic electroluminescence device.

16. The light emitting device according to claim 10, wherein the periodic structure is formed of metal.

17. The light emitting device according to claim 10, wherein the periodic structure is a periodic structure of a high refractive index material formed in a low refractive index material.

18. A display apparatus comprising the light emitting device according to claim 10.

* * * * *